United States Patent
Kim et al.

(10) Patent No.: US 10,020,447 B2
(45) Date of Patent: Jul. 10, 2018

(54) METHOD OF MANUFACTURING ORGANIC LIGHT-EMITTING DISPLAY APPARATUS AND ORGANIC LIGHT-EMITTING DISPLAY APPARATUS

(71) Applicant: Samsung Display Co., Ltd., Yongin-si (KR)

(72) Inventors: Waljun Kim, Yongin-si (KR); Yeonhong Kim, Yongin-si (KR); Junghyun Kim, Yongin-si (KR); Jongyun Kim, Yongin-si (KR); Sungeun Lee, Yongin-si (KR); Kwangyoung Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/861,541

(22) Filed: Jan. 3, 2018

(65) Prior Publication Data

US 2018/0130950 A1    May 10, 2018

Related U.S. Application Data

(62) Division of application No. 15/093,319, filed on Apr. 7, 2016, now Pat. No. 9,893,285.

(30) Foreign Application Priority Data

Oct. 23, 2015    (KR) .................. 10-2015-0148024

(51) Int. Cl.
*H01L 51/00* (2006.01)
*H01L 51/56* (2006.01)
(Continued)

(52) U.S. Cl.
CPC ...... *H01L 51/0018* (2013.01); *H01L 27/3244* (2013.01); *H01L 51/5012* (2013.01);
(Continued)

(58) Field of Classification Search
CPC ............. H01L 51/0018; H01L 51/5012; H01L 51/5221; H01L 51/56; H01L 27/3244; H01L 27/3246
See application file for complete search history.

(56) References Cited

U.S. PATENT DOCUMENTS 7,839,081 B2    11/2010    Kubota et al.
9,318,544 B2     4/2016    Chung et al.
(Continued)

FOREIGN PATENT DOCUMENTS

KR    1020130073057    7/2013
KR    1020150004126    1/2015
KR    1020150042367    4/2015

OTHER PUBLICATIONS

Extended European Search Report dated Mar. 2, 2017 in European Patent Application No. 16178294.1.
(Continued)

*Primary Examiner* — Nicholas Tobergte
(74) *Attorney, Agent, or Firm* — H.C. Park & Associates, PLC

(57) ABSTRACT

A method of manufacturing an organic light-emitting display apparatus using a light-blocking photoresist layer which minimizes damage to an intermediate layer, including an emission layer, during a process for manufacturing the organic light-emitting display apparatus.

10 Claims, 20 Drawing Sheets

(51) Int. Cl.
*H01L 27/32* (2006.01)
*H01L 51/52* (2006.01)
*H01L 51/50* (2006.01)

(52) U.S. Cl.
CPC .......... *H01L 51/5221* (2013.01); *H01L 51/56* (2013.01); *H01L 27/3246* (2013.01); *H01L 2227/323* (2013.01)

(56) References Cited

U.S. PATENT DOCUMENTS

| | | |
|---|---|---|
| 2008/0030833 A1 | 2/2008 | Park |
| 2012/0327064 A1 | 12/2012 | Qi et al. |
| 2013/0084667 A1 | 4/2013 | Otsuka et al. |
| 2014/0027720 A1 | 1/2014 | Kim et al. |
| 2015/0021571 A1 | 1/2015 | Yamakita |
| 2015/0044801 A1 | 2/2015 | Lee et al. |
| 2015/0076472 A1 | 3/2015 | Yamazaki et al. |
| 2015/0102291 A1 | 4/2015 | Park et al. |

OTHER PUBLICATIONS

Non-Final Office Action dated Mar. 22, 2017, issued in U.S. Appl. No. 15/093,319.
Final Office Action dated Jul. 18, 2017, issued in U.S. Appl. No. 15/093,319.
Notice of Allowance dated Oct. 4, 2017, issued in U.S. Appl. No. 15/093,319.

METHOD OF MANUFACTURING ORGANIC LIGHT-EMITTING DISPLAY APPARATUS AND ORGANIC LIGHT-EMITTING DISPLAY APPARATUS

CROSS-REFERENCE TO RELATED APPLICATIONS

This application is a Divisional of U.S. patent application Ser. No. 15/093,319, filed on Apr. 7, 2016, and claims priority from and the benefit of Korean Patent Application No. 10-2015-0148024, filed on Oct. 23, 2015, which are hereby incorporated by reference for all purposes as if fully set forth herein.

BACKGROUND

Field

Exemplary embodiments relate to a method of manufacturing an organic light-emitting display apparatus and the organic light-emitting display apparatus. More particularly, exemplary embodiments relate to a method of easily manufacturing an organic light-emitting display apparatus while minimizing the likelihood of damage to an emission portion including an emission layer and the organic light-emitting display apparatus.

Discussion of the Background

An organic light-emitting display apparatus includes, as each pixel/sub-pixel, an organic light-emitting device having an intermediate layer including an emission layer disposed between a pixel electrode and an opposite electrode. Such an organic light-emitting display apparatus generally controls whether each pixel emits, or an emission degree of each pixel, through a thin film transistor electrically connected to the pixel electrode. The opposite electrode is integrally formed with a plurality of pixels/sub-pixels. In particular, the emission layer is necessarily patterned for each pixel/sub-pixel.

However, in a conventional organic light-emitting display apparatus, a complex process is needed to pattern the emission layer, etc., for each pixel/sub-pixel, or otherwise the emission layer may be easily damaged during a patterning process.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of manufacturing an organic light-emitting display apparatus while minimizing damage to an emission portion, including an emission layer, and the organic light-emitting display apparatus in order to solve the above-described problem.

Additional aspects will be set forth in part in the description which follows and, in part, will be apparent from the disclosure, or may be learned by practice of the inventive concept.

An exemplary embodiment discloses a method of manufacturing an organic light-emitting display apparatus including forming a first pixel electrode and a second pixel electrode that are spaced apart from each other; forming an insulating layer that covers the first pixel electrode and the second pixel electrode; patterning the insulating layer to cover the second pixel electrode and to expose at least a center portion of the first pixel electrode; forming a first intermediate layer including a first emission layer over the exposed center portion of the first pixel electrode and the insulating layer; forming a first upper electrode over the first intermediate layer to correspond to at least the first pixel electrode; forming a light-blocking first photoresist layer over the first upper electrode to correspond to the first pixel electrode and not to correspond to the second pixel electrode; removing parts of the first intermediate layer and the first upper electrode that are exposed outside the first photoresist layer; removing the first photoresist layer; patterning the insulating layer to expose at least a center portion of the second pixel electrode; forming a second intermediate layer including a second emission layer over the exposed center portion of the second pixel electrode and the first upper electrode; forming a second upper electrode over the second intermediate layer to correspond to at least the second pixel electrode; forming a light-blocking second photoresist layer over the second upper electrode to correspond to the second pixel electrode and not to correspond to the first pixel electrode; removing parts of the second intermediate layer and the second upper electrode that are exposed outside the second photoresist layer; and removing the second photoresist layer.

An exemplary embodiment also discloses an organic light-emitting display apparatus including a first pixel electrode and a second pixel electrode that are spaced apart from each other; an insulating layer that exposes at least a center portion of each of the first pixel electrode and the second pixel electrode; a first intermediate layer located over the first pixel electrode and including a first emission layer; a second intermediate layer located over the second pixel electrode and including a second emission layer; a first upper electrode and a second upper electrode that respectively correspond to the first intermediate layer and the second intermediate layer and are spaced apart from each other; a filling layer that covers the first upper electrode and the second upper electrode and includes contact holes that expose a part of each of the first upper electrode and the second upper electrode; and a common electrode that is located over the filling layer and contacts the first upper electrode and the second upper electrode through the contact holes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
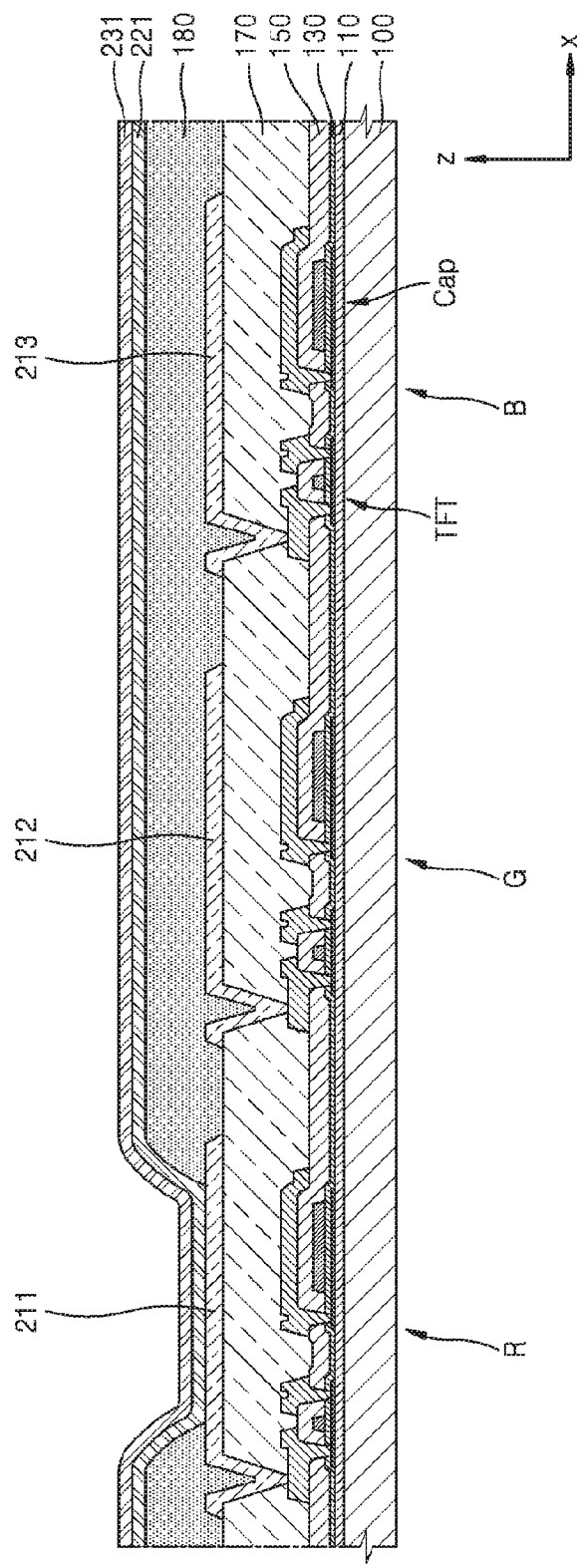
FIG. 1, FIG. 2, FIG. 3, FIG. 4, FIG. 5, FIG. 6, FIG. 7, FIG. 8, FIG. 9, FIG. 10, FIG. 11, and FIG. 12 are schematic cross-sectional views of processes of a method of manufacturing an organic light-emitting display apparatus, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly-used dictionaries, should be interpreted as having a meaning that is consistent with their meaning in the context of the relevant art and will not be interpreted in an idealized or overly formal sense, unless expressly so defined herein.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIGS. 1 through 12 are schematic cross-sectional views of processes of a method of manufacturing an organic light-emitting display apparatus, according to an exemplary embodiment.

A backplane may be initially prepared. The backplane includes a substrate 100 and a plurality of pixel electrodes 211, 212, and 213 that are located over the substrate 100 and are spaced apart from each other.

The substrate 100 may be formed of various materials, including glass, metals, plastics, such as polyethylene terephthalate (PET), polyethylene naphthalate (PEN), and polyimide, or the like. The substrate 100 may include a display region, over which a plurality of pixels are arranged, and a peripheral region surrounding the display region.

Each of the pixel electrodes 211, 212, and 213 may correspond to a sub-pixel. That is, the first pixel electrode 211, the second pixel electrode 212, and the third pixel electrode 213 may be understood to correspond to a red sub-pixel R, a green sub-pixel G, and a blue sub-pixel G, respectively. This is an example. Sub-pixels included in one pixel may have various configurations. For example, if necessary, one pixel may include only two sub-pixels or four or more sub-pixels. For convenience of description, a case where one pixel includes three sub-pixels will now be described below.

The pixel electrodes 211, 212, and 213 may be translucent or transparent electrodes, or reflective electrodes. When the pixel electrodes 211, 212, and 213 are translucent or transparent electrodes, the pixel electrodes 211, 212, and 213 may include, for example, indium tin oxide (ITO), indium zinc oxide (IZO), zinc oxide (ZnO), indium oxide ($In_2O_3$), indium gallium oxide (IGO), or aluminium zinc oxide (AZO). When the pixel electrodes 211, 212, and 213 are reflective electrodes, the pixel electrodes 211, 212, and 213 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or combinations thereof, and a layer formed of ITO, IZO, ZnO, or $In_2O_3$. The configuration and materials of the pixel electrodes 211, 212, and 213 are not limited thereto, and may be variously modified.

The pixel electrodes 211, 212, and 213 may be located in the display region of the substrate 100.

The backplane may further include various other elements. For example, as shown in FIG. 1, a thin film transistor TFT or a capacitor Cap may be formed over the substrate 100. The backplane may include other elements, such as a buffer layer 110 used to prevent impurities from penetrating a semiconductor layer of the thin film transistor TFT, a gate insulating layer 130 used to insulate the semiconductor layer of the thin film transistor TFT and a gate electrode from each other, an interlayer insulating layer 150 used to insulate source/drain electrodes of the thin film transistor TFT and the gate electrode from each other, a planarization layer 170 covering the thin film transistor TFT and having an approximately flat upper surface, or the like.

As described above, after the backplane is prepared, an insulating layer 180 may be formed to cover the first pixel electrode 211, the second pixel electrode 212, and the third pixel electrode 213. The insulating layer 180 may be utilized as a pixel-defining layer later. Then, the insulating layer 180 may be patterned such that at least a center portion of the first pixel electrode 211 is exposed while the second pixel electrode 212 and the third pixel electrode 213 remain covered. The insulating layer 180 may be patterned using various methods. A usual photoresist may be used to pattern the insulating layer 180.

Thereafter, as shown in FIG. 1, a first intermediate layer 221, including a first emission layer, may be formed over the exposed portion of the first pixel electrode 211 and the insulating layer 180. A first upper electrode 231 may be formed over the first intermediate layer 221 such that the first upper electrode 231 corresponds to at least the first pixel electrode 211. In this regard, the first intermediate layer 221 and the first upper electrode 231 may be formed over an entire surface of the substrate 100.

The first intermediate layer 221 may have, for example, a multilayer structure, including the first emission layer that may consist of a red emission layer, for example, a hole injection layer (HIL), a hole transport layer (HTL), the first emission layer, an electron transport layer (ETL), and/or an electron injection layer (EIL). The first intermediate layer 221 may be formed by using various methods, such as a deposition method or a spin coating method, etc. The first upper electrode 231 may consist of a transparent or translucent electrode. To this end, the first upper electrode 231 may include a layer formed of Li, Ca, LiF/Ca, LiF/Al, Al, Mg, or a combination thereof, and another layer formed of a transparent or translucent material, such as ITO, IZO, ZnO, or $In_2O_3$. If necessary, the first upper electrode 231 may be a reflective electrode formed of reflective metal.

Figure 2:
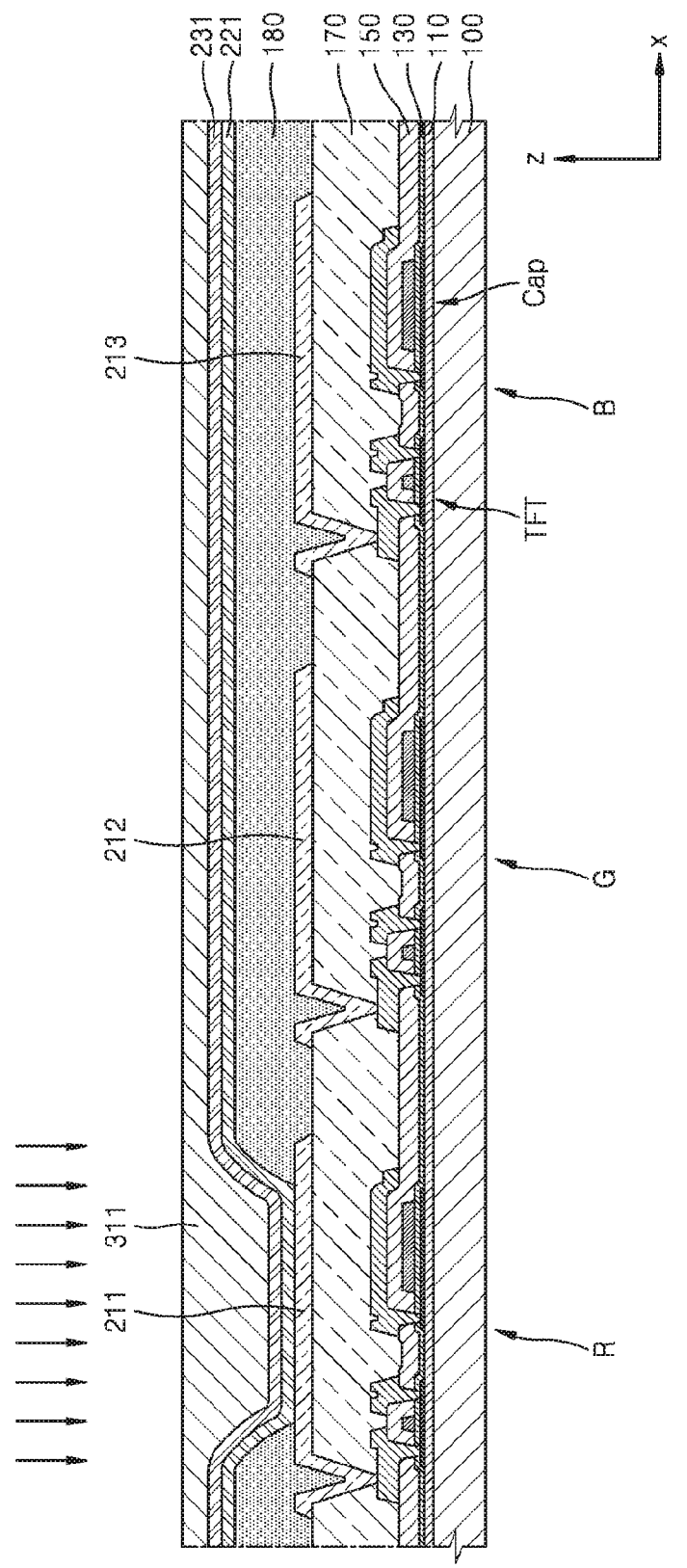
Figure 3:
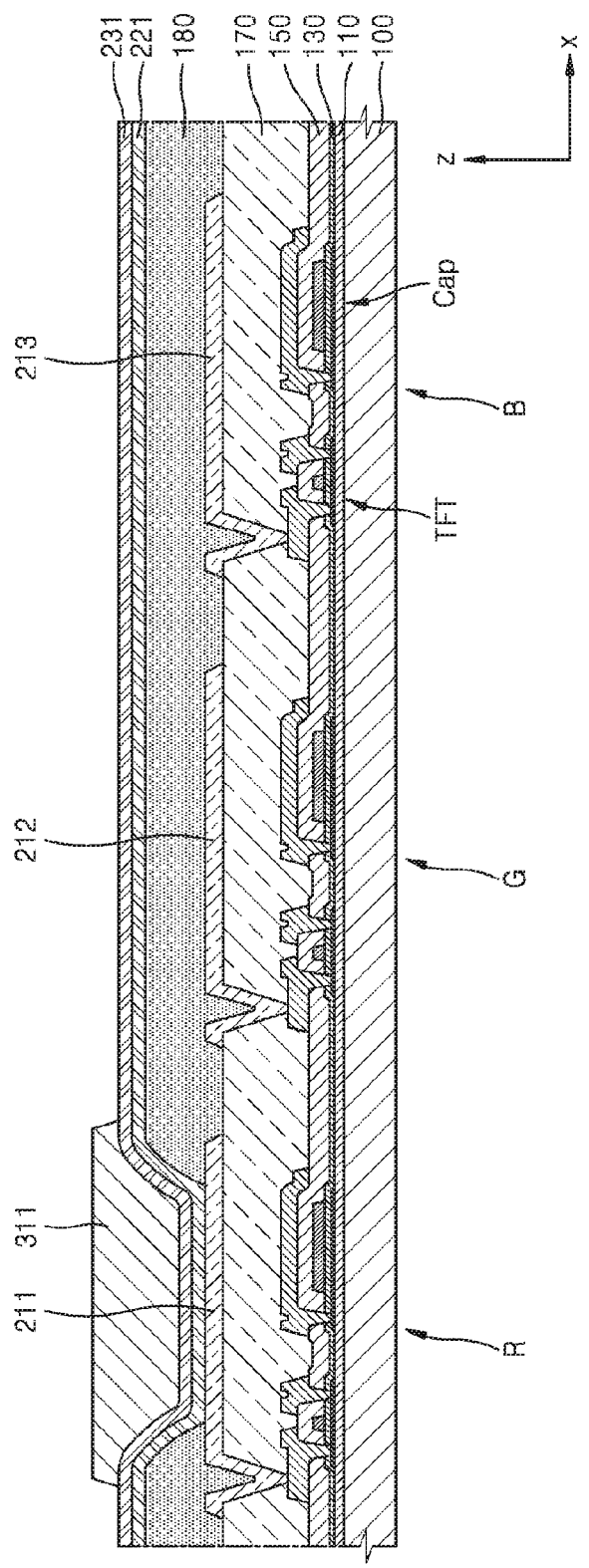

Thereafter, as shown in FIG. 2, a light-blocking first photoresist layer 311 may be formed to cover the first pixel electrode 211, the second pixel electrode 212, and the third pixel electrode 213. In this regard, the light-blocking first photoresist layer 311 may have a characteristic of blocking at least ultraviolet rays. For example, a usual black photoresist material may be used. After the first photoresist layer 311 is formed, only a specific part of the first photoresist layer 311 may be exposed to ultraviolet rays and developed such that the first photoresist layer 311 may correspond to the first pixel electrode 211 but not correspond to the second pixel electrode 212 or the third pixel electrode 213, as shown in FIG. 3. As a result, the light locking first photoresist layer 311 may be formed over the first upper electrode 231.

An exposure process may be used to form the first photoresist layer 311, as described above. The first photoresist layer 311 may have a light-blocking characteristic, thereby effectively preventing the first intermediate layer 221 including the first emission layer from being damaged during the exposure process.

Meanwhile, in order to minimize a possibility of damaging a part on the first pixel electrode 211 of the first intermediate layer 221 during the exposure process, the number of times exposure processes are performed to correspond to the part on the first pixel electrode 211 of the first intermediate layer 221 during the entire process of manufacturing the organic light-emitting display apparatus need to be reduced. This is to prevent deterioration of the part on the first pixel electrode 211 of the first intermediate layer 221, which is likely to occur even though a used photoresist layer has the light-blocking characteristic. The exposure process may be performed in not only a process of patterning the first intermediate layer 221 to correspond to the first pixel electrode 211, but also a process of patterning a second intermediate layer to correspond to the second pixel electrode 212 and a process of patterning a third intermediate layer to correspond to the third pixel electrode 213, as will be described later. Thus the first photoresist layer 311 may include a negative photoresist material.

In this case, as shown in FIG. 2, ultraviolet rays may be irradiated onto a part of the first photoresist layer 311 corresponding to the first pixel electrode 211. Thus, the exposure process may be also performed to correspond to the second pixel electrode 212 and the third pixel electrode 213 in the process of patterning the second intermediate layer to correspond to the second pixel electrode 212 and the process of patterning the third intermediate layer to correspond to the third pixel electrode 213 later. Therefore, in consideration of the entire process of manufacturing the organic light-emitting display apparatus, no exposure process may be performed on the part of the first intermediate layer 221 corresponding to the first pixel electrode 211 in the process of patterning the second intermediate layer or the third intermediate layer.

In the meantime, if the first photoresist layer 311 includes a positive photoresist layer, when the exposure process is performed on the first photoresist layer 311 in order to pattern the first intermediate layer 221, the part of the first photoresist layer 311 that is not corresponding to the first pixel electrode 211 is exposed to ultraviolet rays. In particular, the part of the first photoresist layer 311 corresponding to the first pixel electrode 211 may be exposed to ultraviolet rays in each of the processes of patterning the second intermediate layer and the third intermediate layer. Thus, the first photoresist layer 311 may include the negative photoresist material.

Figure 4:
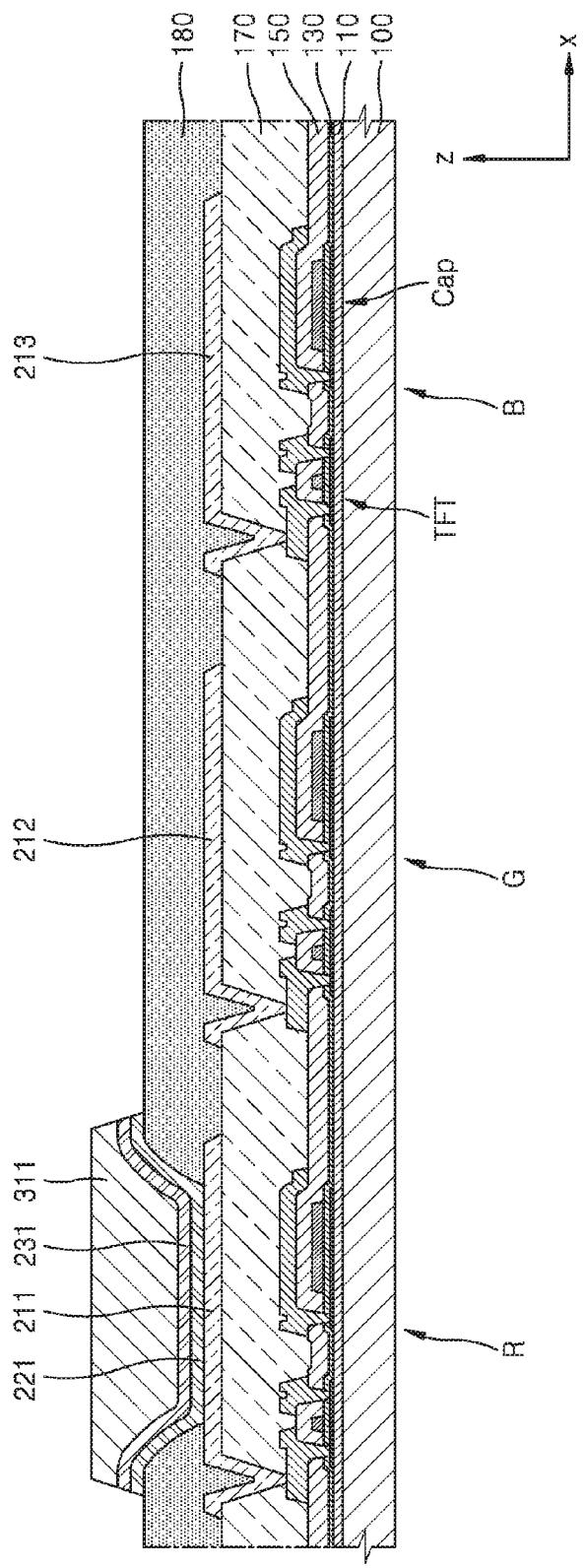
Figure 5:
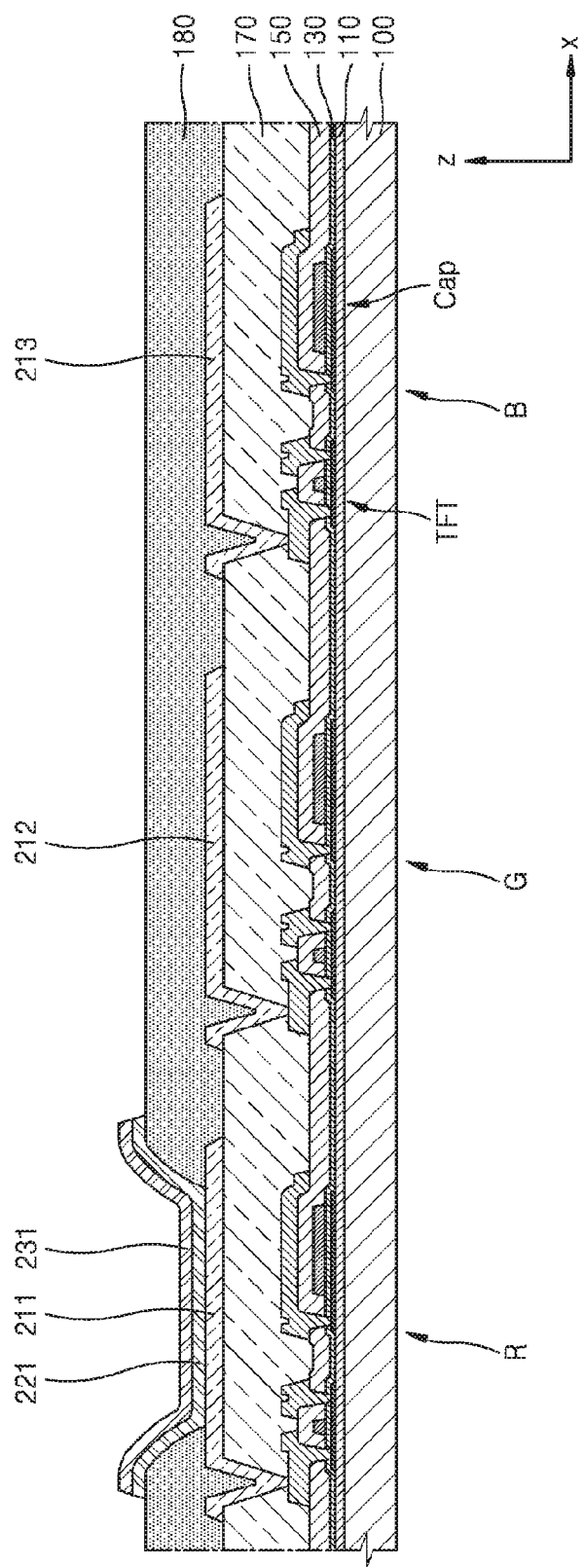

After the first photoresist layer 311 is formed, as shown in FIG. 3, parts of the first intermediate layer 221 and the first upper electrode 231 that are exposed outside the first photoresist layer 311 may be removed, as shown in FIG. 4. This may be performed by using a dry etching method. The first photoresist layer 311 may be removed through ashing by using O₂ plasma. Thus, as shown in FIG. 5, only the patterned first intermediate layer 221 and first upper electrode 231 may remain.

Figure 6:
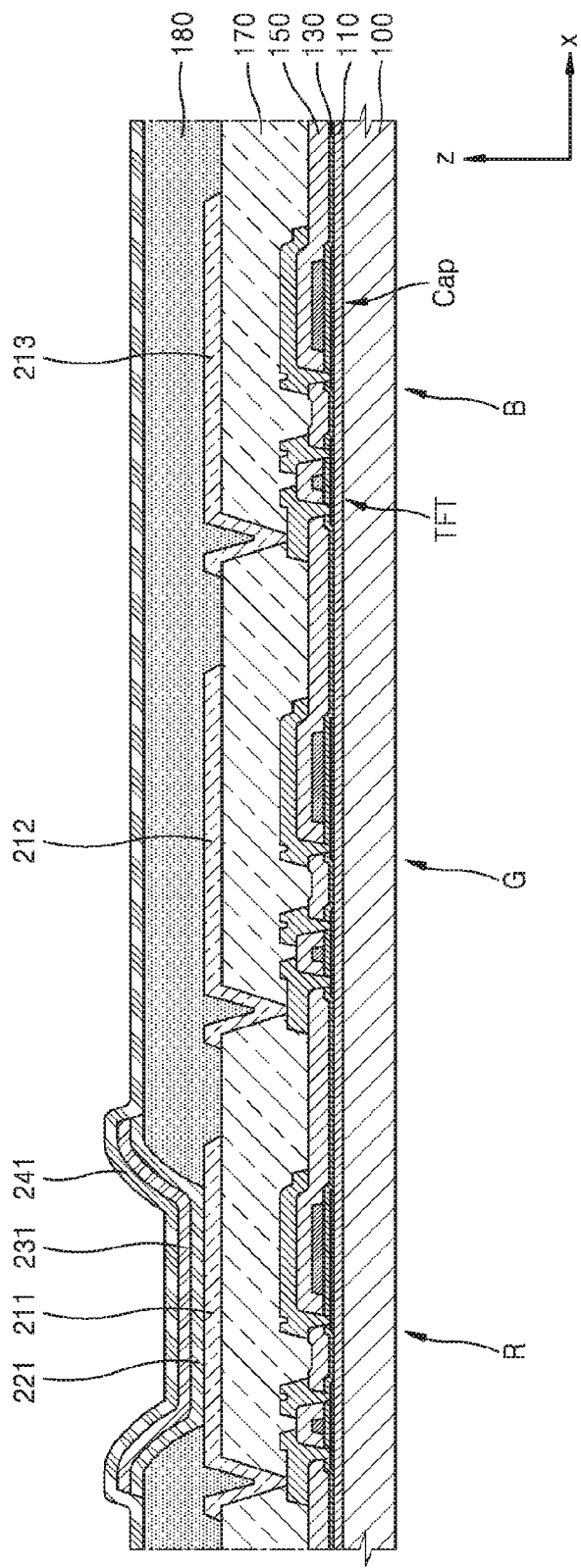
Figure 7:
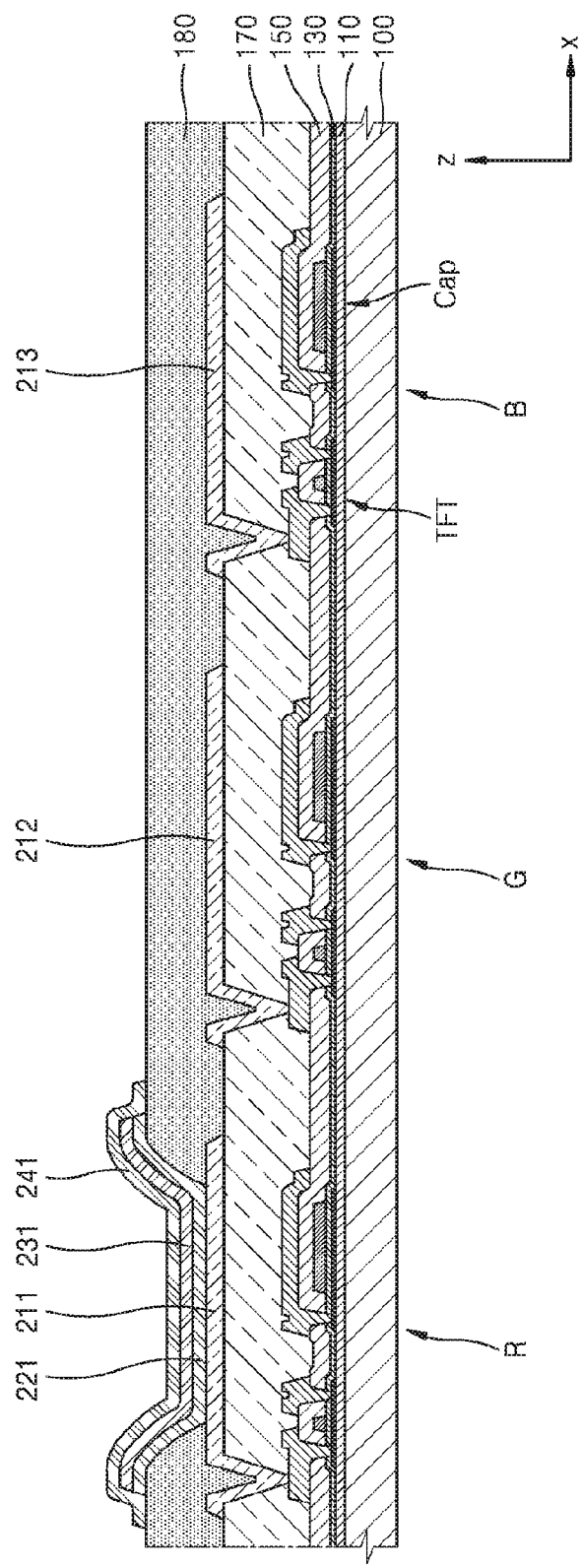

Thereafter, as shown in FIG. 6, a first protection layer 241 may be formed to cover the first intermediate layer 221 and the first upper electrode 231. The first protection layer 241 may be formed of, for example, silicon nitride, silicon oxide, or silicon oxynitride, etc. As shown in FIG. 7, the first protection layer 241 may be patterned to correspond to the first pixel electrode 211. A photoresist material may be used to pattern the first protection layer 241. In this regard, a light-blocking photoresist material may also be used to prevent the first intermediate layer 221 from being damaged during the exposure process. The first protection layer 241 formed through this process may cover an upper surface of the first upper electrode 231 (in the positive Z direction), a side surface of the first upper electrode 231, and a side surface of the first intermediate layer 221. The negative photoresist material may be used in a process of patterning not only the first protection layer 241, but also in process of patterning a second protection layer or a third protection layer that will be described later. This is to minimize the number of times exposure processes using ultraviolet rays are performed to correspond to the first intermediate layer 221 in consideration of the processes of patterning the first protection layer 241 through the third protection layer.

Figure 8:
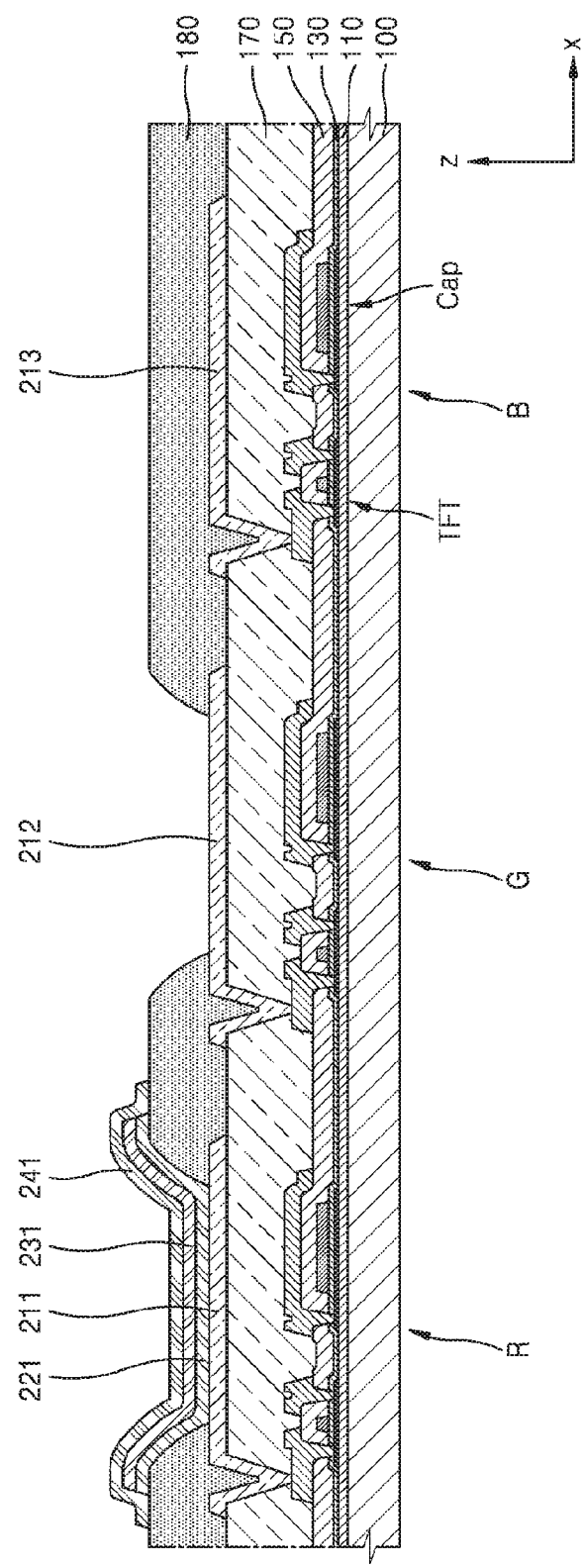

Thereafter, the insulating layer 180 may be patterned to expose at least a center portion of the second pixel electrode 212, as shown in FIG. 8. Through a process similar to that described with reference to FIGS. 1 through 5 above, a second intermediate layer 222 and a second upper electrode 232 that are patterned to correspond to the second pixel electrode 212 may be formed.

As shown in FIG. 8, even when the insulating layer 180 is patterned in order to expose at least the center portion of the second pixel electrode 212, a light-blocking photoresist may be used. However, in this case, a positive photoresist having the light-blocking characteristic may be used. To pattern the insulating layer 180 in order to expose at least the center portion of the second pixel electrode 212, a part of a photoresist layer that is formed over the insulating layer 180 and corresponds to the center portion of the second pixel electrode 212 may be necessarily removed. When the positive photoresist is used, the exposure process may be performed on only a part of the positive photoresist that is to be removed. Thus, the exposure process may be performed on only a part of the positive photoresist corresponding to the center portion of the second pixel electrode 212, thereby preventing the previously formed first intermediate layer 221 from being damaged due to ultraviolet rays.

The second intermediate layer 222, including a second emission layer, may be formed over the exposed part of the second pixel electrode 212 and the first upper electrode 231. In more detail, the second intermediate layer 222 may be formed over most or all of an entire surface of the substrate 100. The second upper electrode 232 may be formed over the second intermediate layer 222 so as to correspond to at least the second pixel electrode 212, for example, over most or all of the entire surface of the substrate 100. Thereafter, a light-blocking second photoresist layer may be formed over the second upper electrode 232 so as to correspond to the second pixel electrode 212 and not to correspond to the first pixel electrode 211; parts of the second intermediate layer 222 and the second upper electrode 232 that are exposed outside the second photoresist layer may be removed; and then the second photoresist layer may be removed. During this process, the first protection layer 241 may protect the patterned first intermediate layer 221 and first upper electrode 231 to prevent the first intermediate layer 221 and first upper electrode 231 from being damaged.

Figure 9:
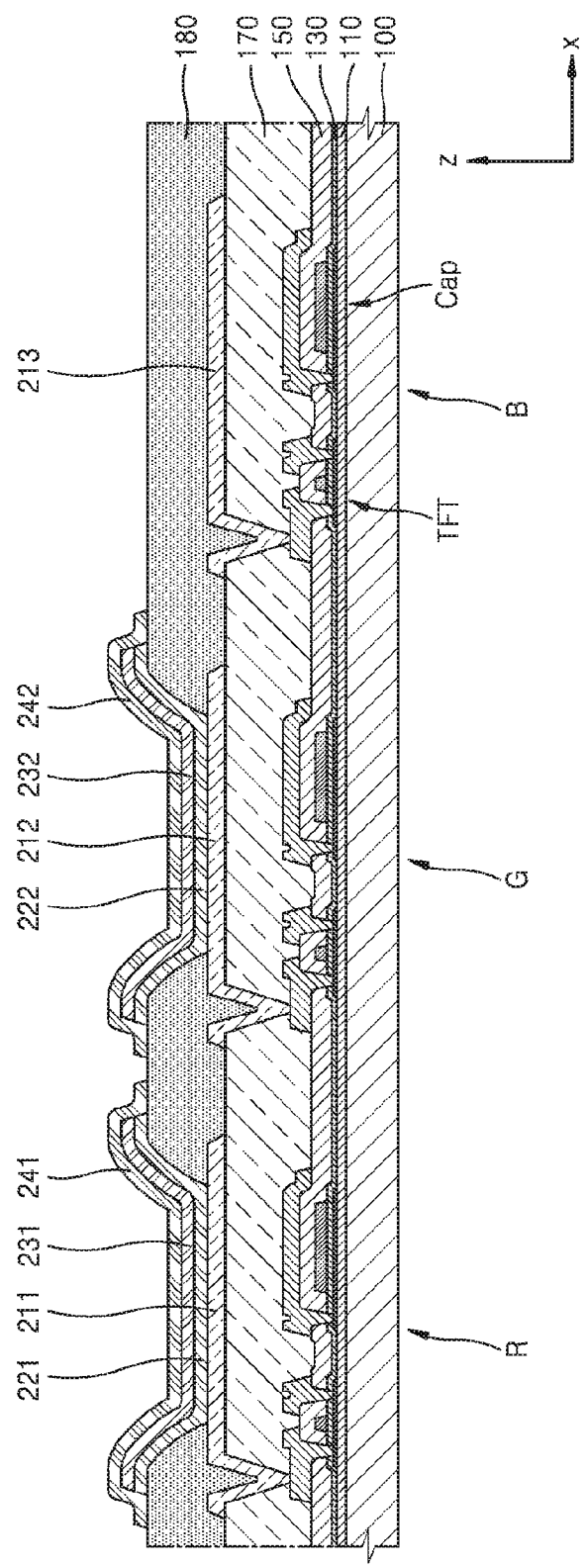
Figure 10:
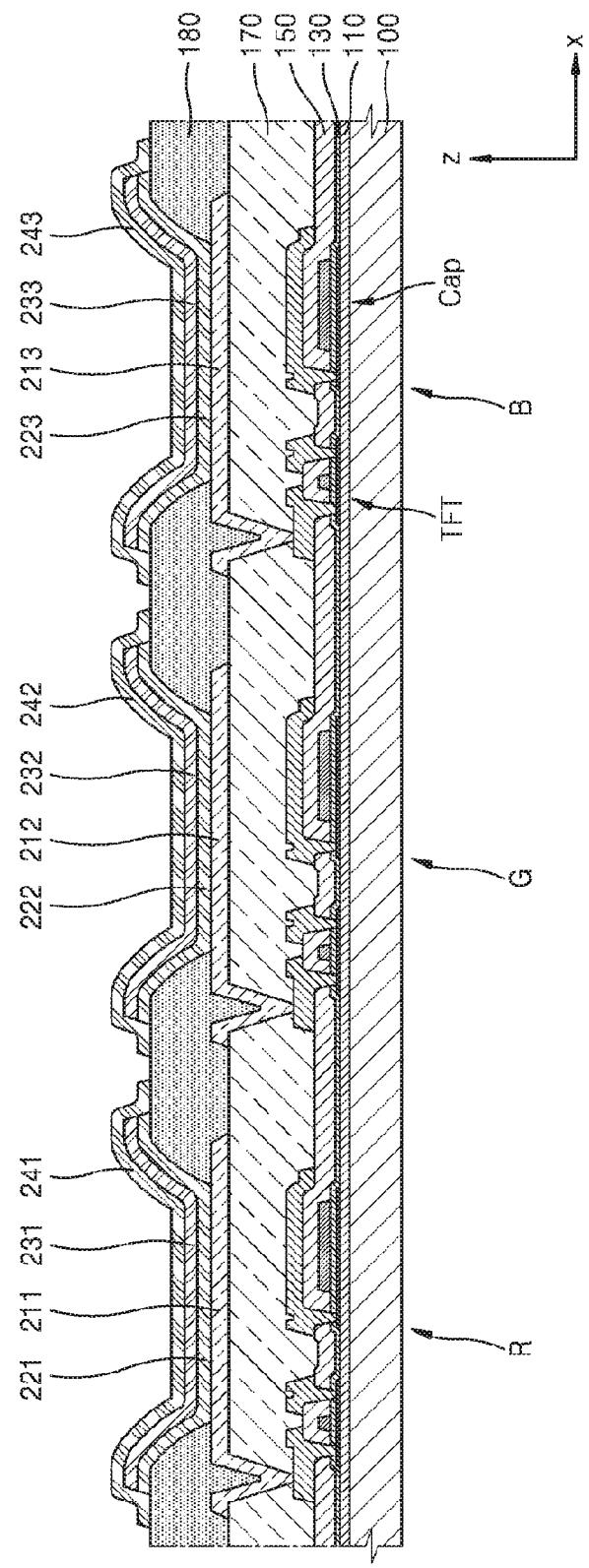

Thereafter, a second protection layer 242 may be formed over most or all of the entire surface of the substrate 100, and patterned to cover the second intermediate layer 222 and the second upper electrode 232, as shown in FIG. 9. The second protection layer 242 formed through this process may cover an upper surface of the second upper electrode 232 (positive Z direction), a side surface of the second upper electrode 232, and a side surface of the second intermediate layer 222, as shown in FIG. 9.

Through the same process as described above, as shown in FIG. 10, a third intermediate layer 223 and a third upper electrode 233 that are patterned to correspond to the third pixel electrode 213 may be located over the third pixel electrode 213 and may be covered by the third protection layer 243.

Figure 11:
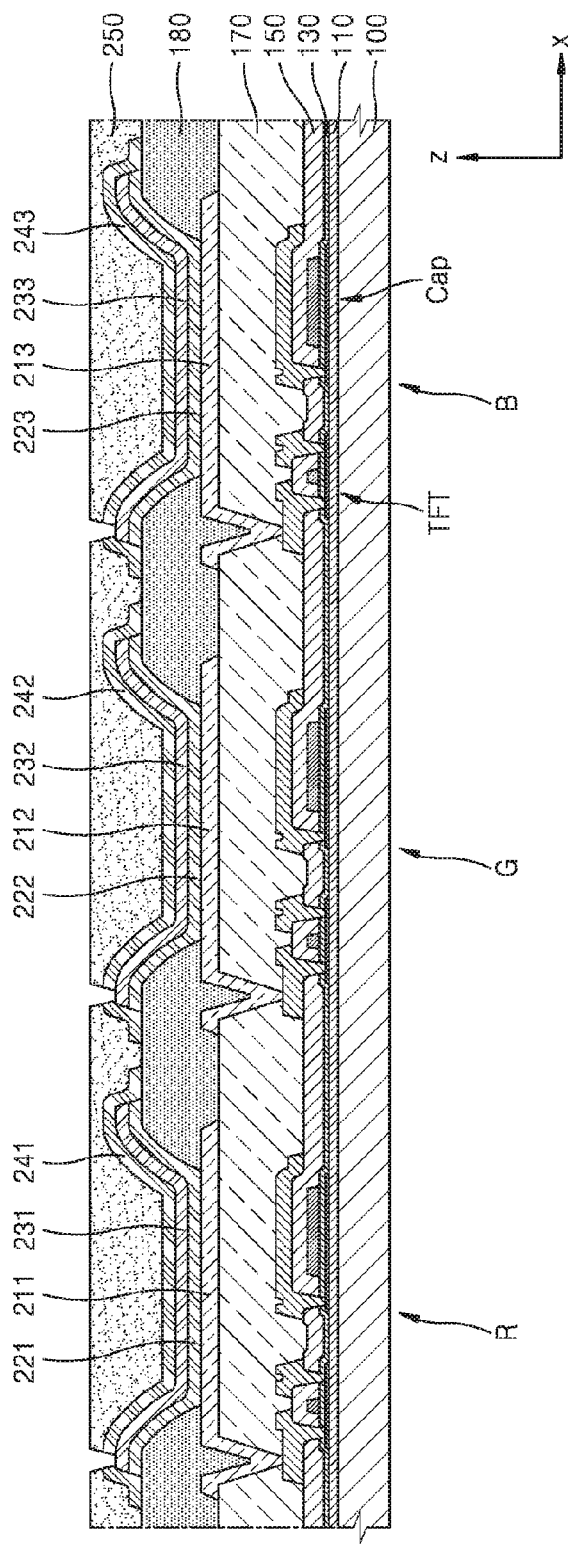

After the first through third intermediate layers 221, 222, and 223, the first through third upper electrodes 231, 232, and 233, and the first through third protection layers 241, 242, and 243 are patterned, as shown in FIG. 11, a filling layer 250 may be formed to cover the first through third protection layers 241, 242, and 243. The filling layer 250 may be formed of, for example, polyimide. Contact holes may be formed in the filling layer 250 and the first through third protection layers 241, 242, and 243 so as to expose at least a part of each of the first through third upper electrodes 231, 232, and 233. The photoresist layer may be used in a process of forming the contact holes, thereby preventing the first through third intermediate layers 221, 222, and 223 from being damaged.

Figure 12:
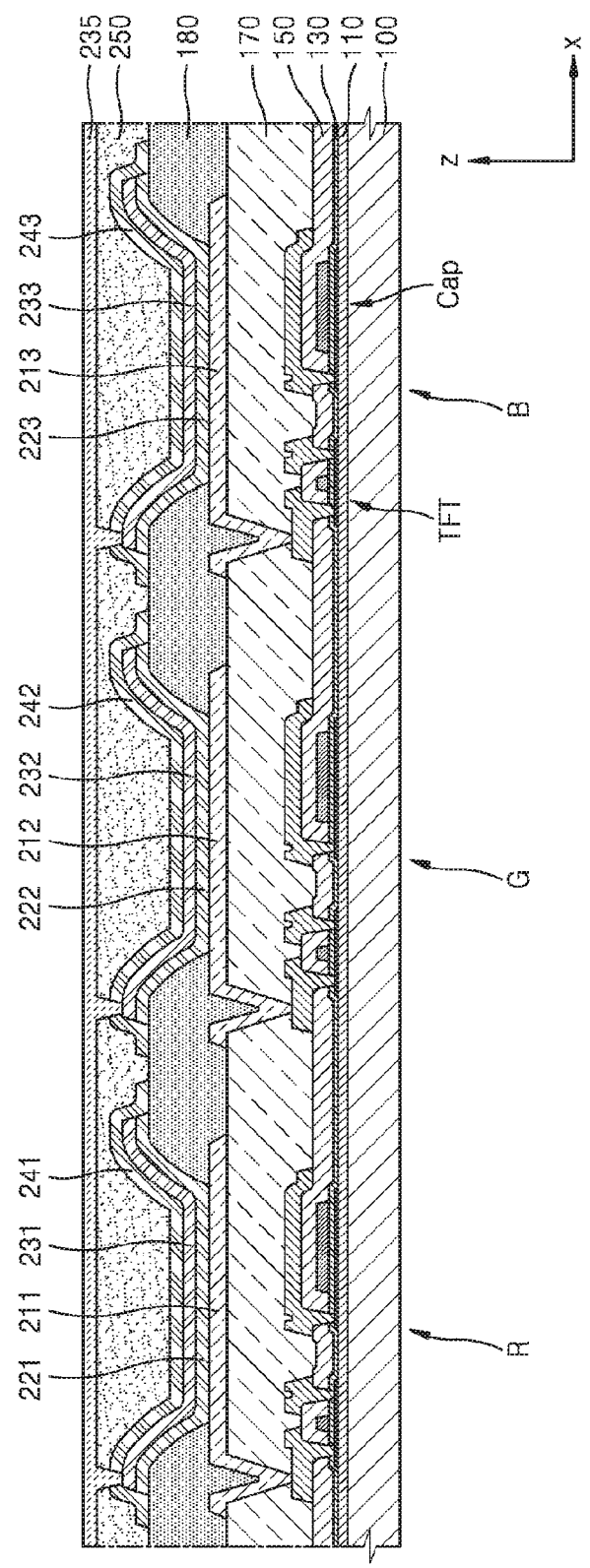

Thereafter, as shown in FIG. 12, a common electrode 235 contacting the first through third upper electrodes 231, 232, and 233 through the contact holes may be formed over the filling layer 250. The common electrode 235 may be a transparent or translucent electrode. To this end, the common electrode 235 may include a layer formed of Li, Ca, LiF/Ca, LiF/Al, Al, Mg, or a combination thereof, and another layer formed of a transparent or translucent material, such as ITO, IZO, ZnO, or $In_2O_3$. The common electrode 235 may be a reflective electrode formed of reflective metal.

The method of manufacturing the organic light-emitting display apparatus according to the present exemplary embodiment may utilize a light-blocking photoresist layer, thereby minimizing damage to an intermediate layer, including an emission layer, during a manufacturing process of the organic light-emitting display apparatus.

In the meantime, the first through third protection layers 241, 242, and 243 may have shapes spaced apart from each other in FIGS. 1 through 12, but the exemplary embodiments are not limited thereto. The second protection layer 243 may be patterned while the first protection layer 241 is patterned, and thus, the second protection layer 243 may be patterned such that the second protection layer 243 is in contact with the first protection layer 241. This may also apply to the third protection layer 243, and thus, the first through third protection layers 241, 242, and 243 may be in contact with each other.

FIGS. 13 through 20 are schematic cross-sectional views of processes of a method of manufacturing an organic light-emitting display apparatus, according to another exemplary embodiment.

Figure 13:
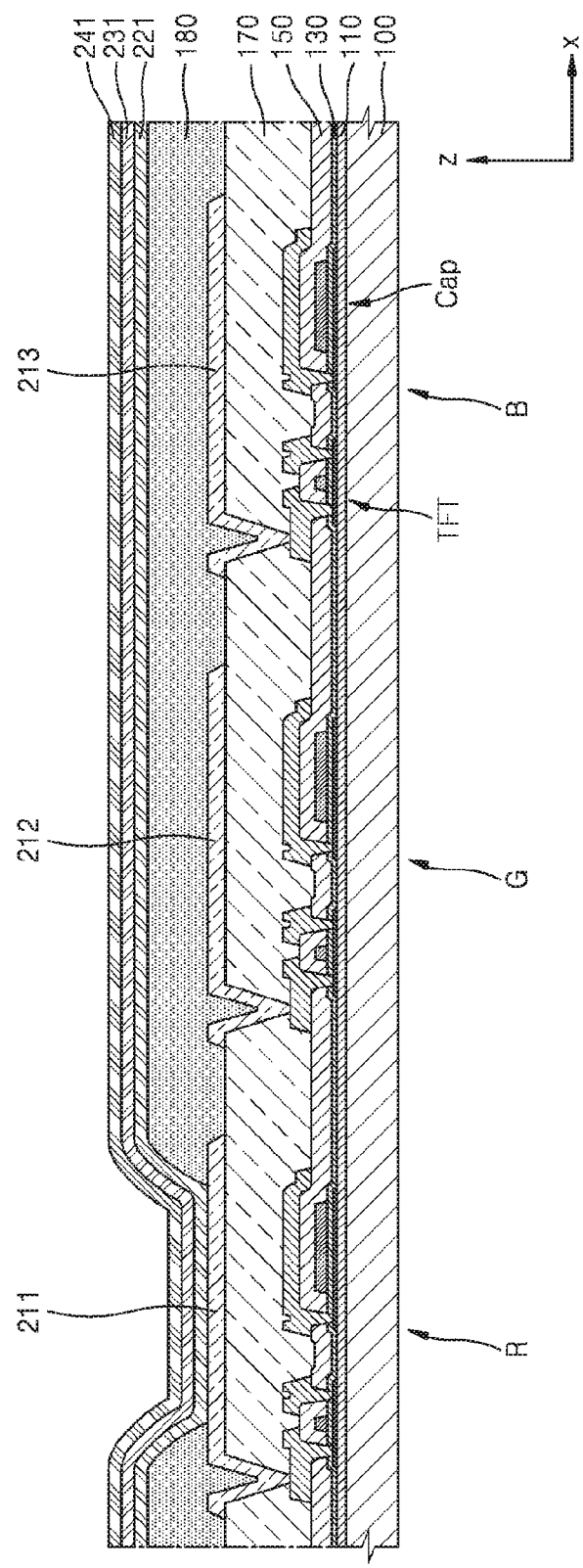
FIG. 13, FIG. 14, FIG. 15, FIG. 16, FIG. 17, FIG. 18, FIG. 19, and FIG. 20 are schematic cross-sectional views of processes of a method of manufacturing an organic light-emitting display apparatus, according to another exemplary embodiment.
Figure 14:
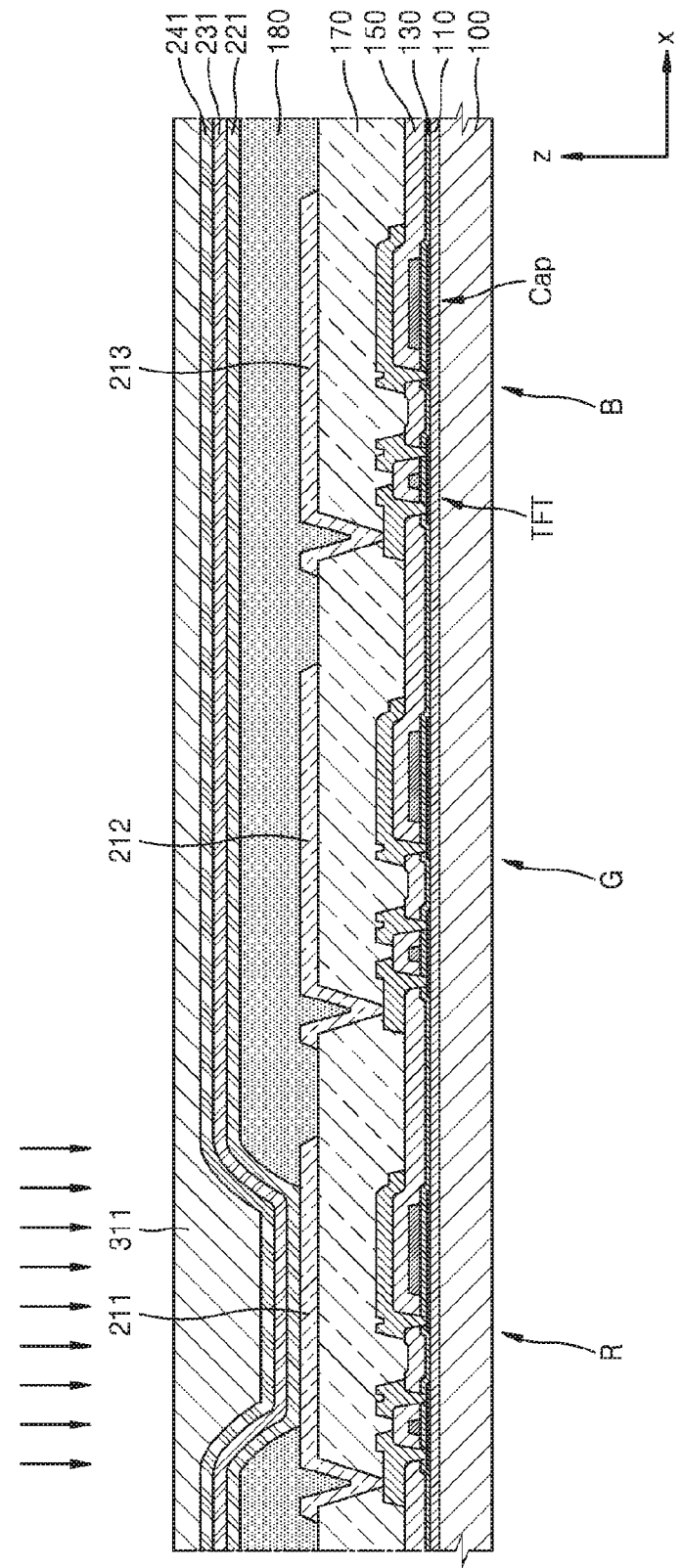
Figure 15:
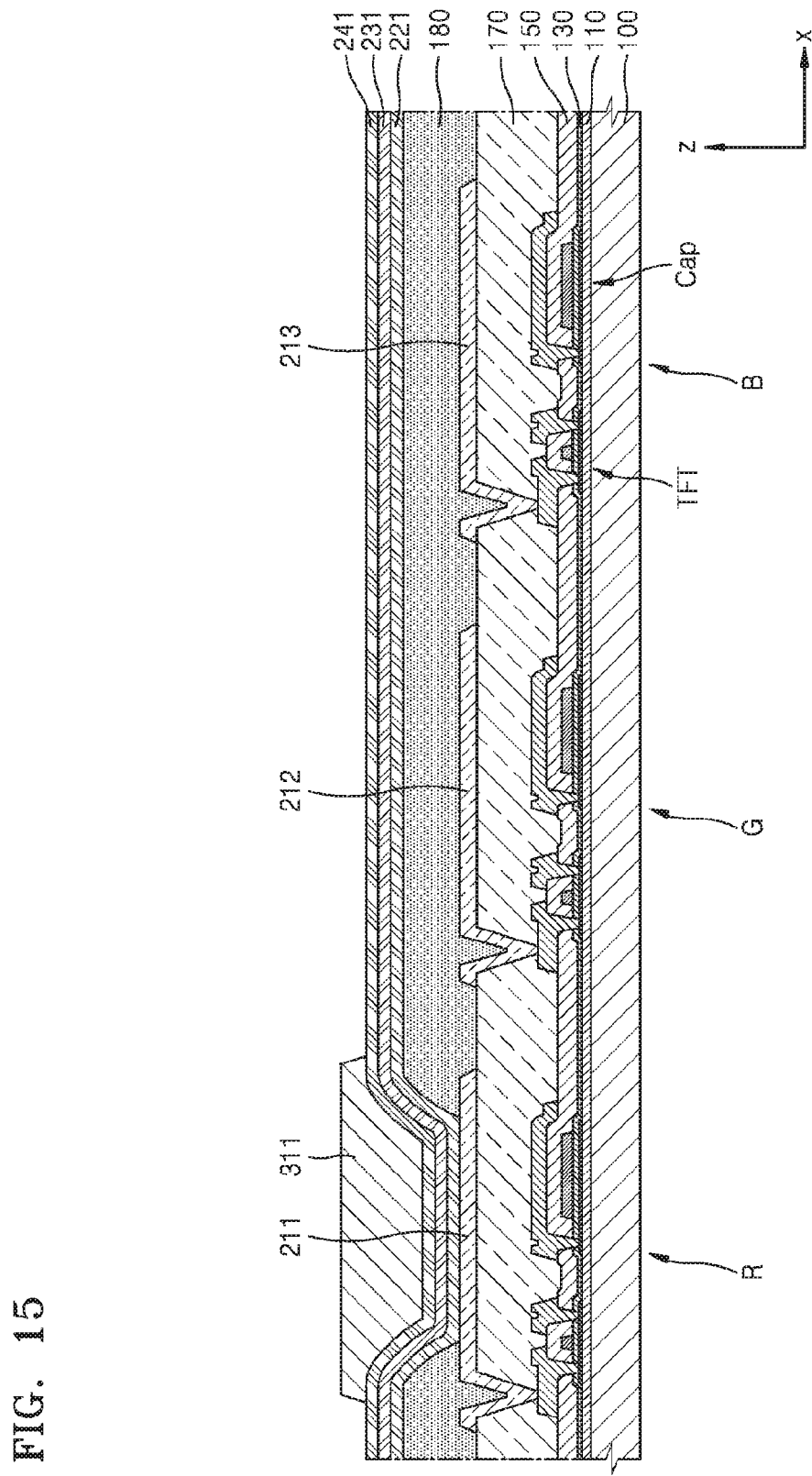
Figure 16:
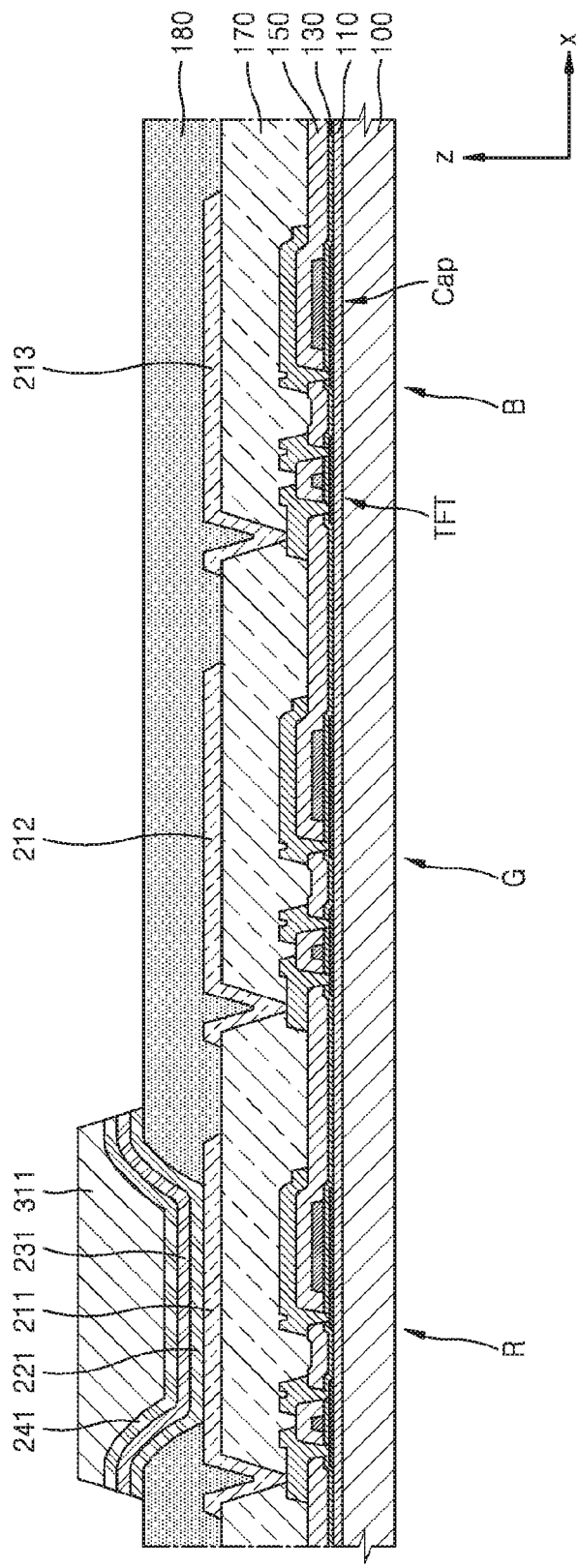
Figure 17:
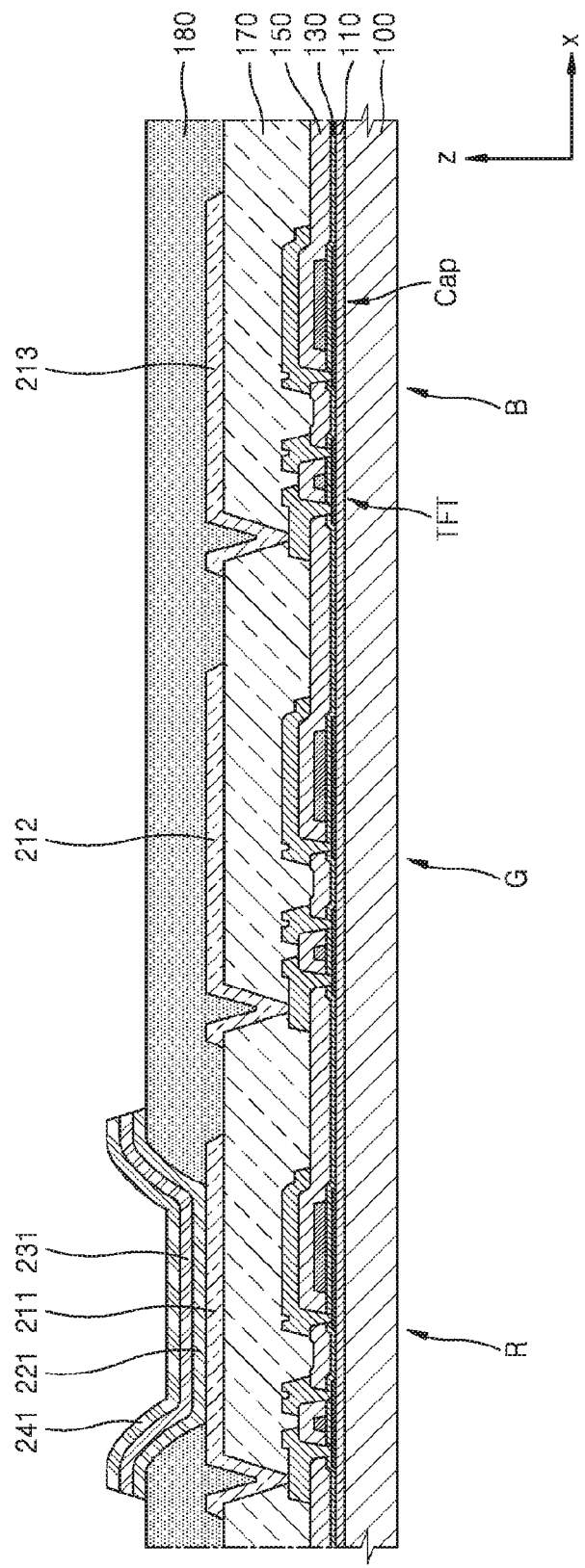

The method of manufacturing the organic light-emitting display apparatus according to the present exemplary embodiment may form the first protection layer 241 over the first upper electrode 231 before patterning the first intermediate layer 221 and the first upper electrode 231, as shown in FIG. 13. Thereafter, as shown in FIG. 14, the first photoresist layer 311 may be formed over the first protection layer 241 and exposed and developed. Thus, as shown in FIG. 15, the first photoresist layer 311 may be formed over the first protection layer 241 in order to correspond to the first pixel electrode 211. The first photoresist layer 311 may include a light-blocking photoresist material, thereby preventing the first intermediate layer 221 from being damaged during an exposure process of the first photoresist layer 311. Thereafter, as shown in FIG. 16, not only parts of the first intermediate layer 221 and the first upper electrode 231 exposed outside the first photoresist layer 311, but also a part of the first protection layer 241 exposed outside the first photoresist layer 311, may be removed by using a dry etching method, and the first photoresist layer 311 may be removed through ashing by using $O_2$ plasma. Thus, as shown in FIG. 17, only the patterned first intermediate layer 221, first upper electrode 231, and the first protection layer 241 may remain.

Figure 18:
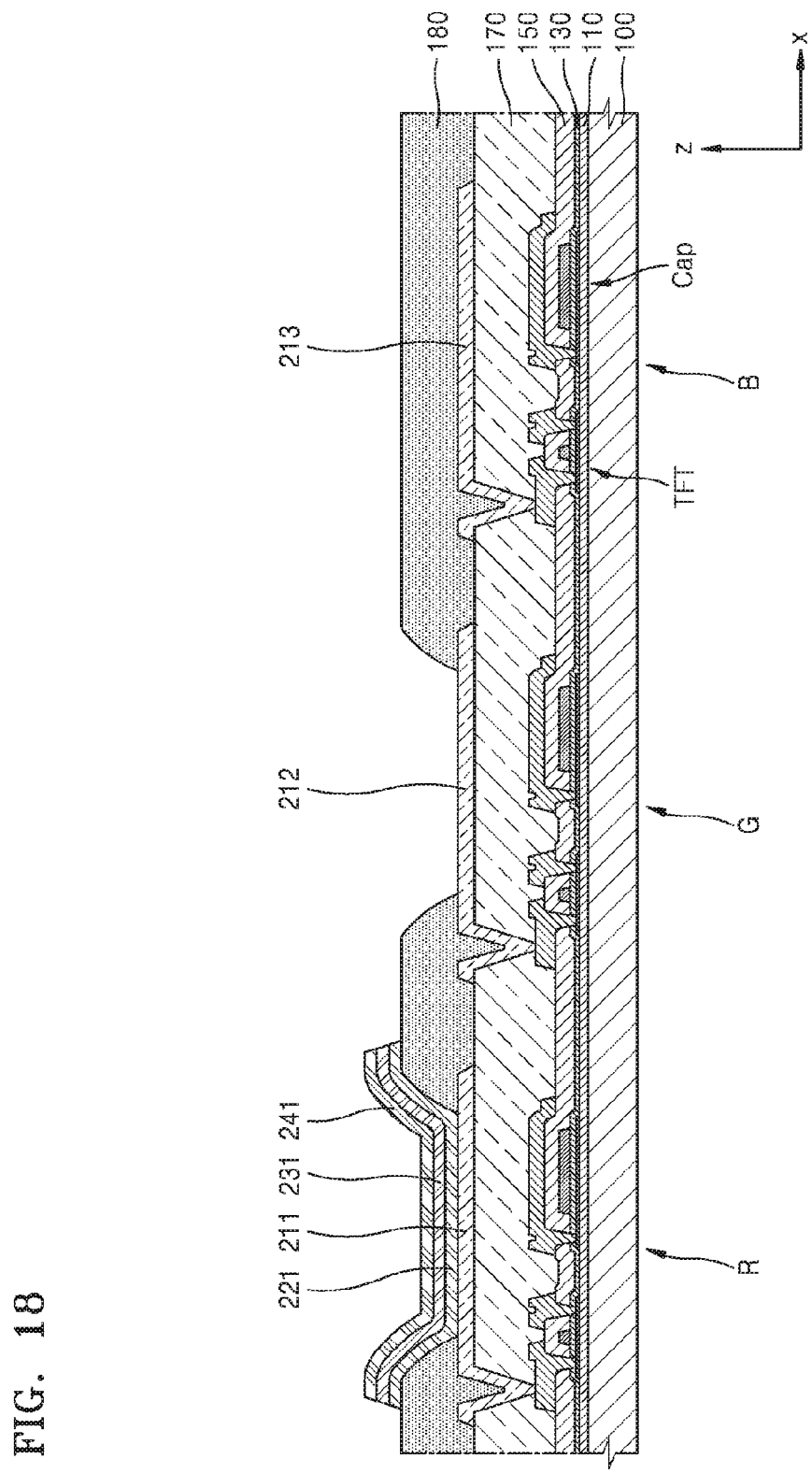
Figure 19:
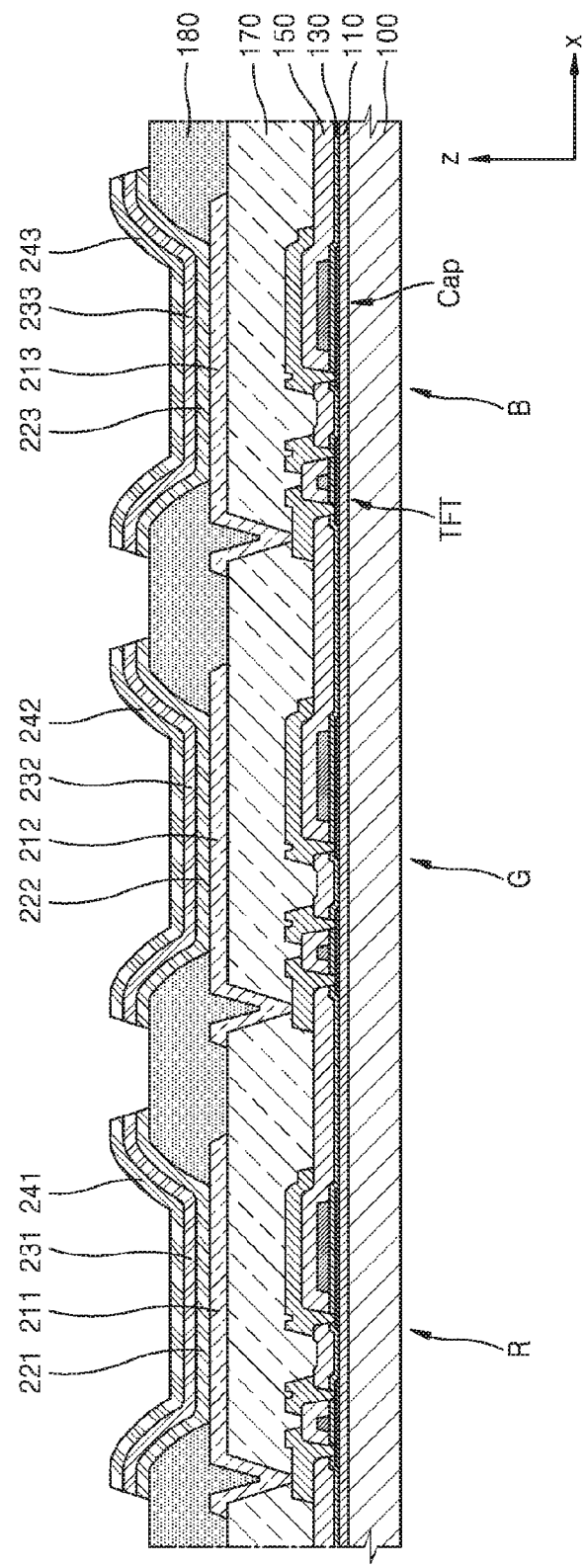

Thereafter, the insulating layer 180 may be patterned to expose at least a center portion of the second pixel electrode 212, as shown in FIG. 18. At least the center portion of the second pixel electrode 212 as shown in FIG. 18 may be exposed through a process similar to that described with reference to FIG. 8 above.

Through a process similar to that described with reference to FIGS. 13 through 17 above, the second intermediate layer 222, the second upper electrode 232, and the second protection layer 242 that are patterned to correspond to the second pixel electrode 212 may be formed. That is, the second intermediate layer 222, including a second emission layer, the second upper electrode 232, and the second protection layer 242 may be formed over the exposed part of the second pixel electrode 212, upper portions of the insulating layer 180 and the first protection layer 241, etc. Thereafter, a light-blocking second photoresist layer may be formed over the second protection layer 242 so as to correspond to the second pixel electrode 212 and not to correspond to the first pixel electrode 211, parts of the second intermediate layer 222, the second upper electrode 232, and the second protection layer 242 that are exposed outside the second photoresist layer may be removed, and then the second photoresist layer may be removed. During this process, the first protection layer 241 may protect the patterned first intermediate layer 221 and first upper electrode 231 to prevent the first intermediate layer 221 and first upper electrode 231 from being damaged.

Through the same process as described above, as shown in FIG. 19, the third intermediate layer 223, the third upper electrode 233, and the third protection layer 243 that are patterned to correspond to the third pixel electrode 213 may be located over the third pixel electrode 213.

Figure 20:
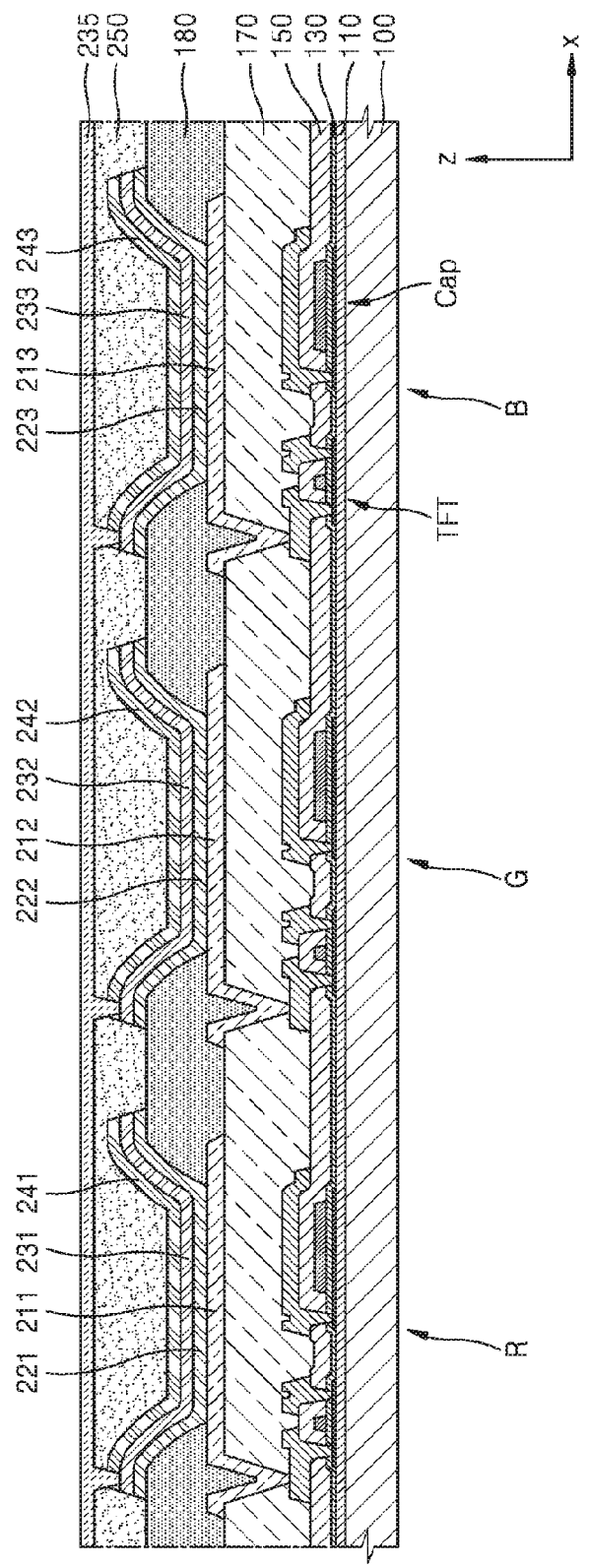

After the first through third intermediate layers 221 through 223, the first through third upper electrodes 231, 232, and 233, and the first through third protection layers 241, 242, and 243 are patterned, as shown in FIG. 20, the filling layer 250 may be formed to cover the first through third protection layers 241 through 243. The filling layer 250 may be formed of, for example, polyimide. Contact holes may be formed in the filling layer 250 and the first through third protection layers 241, 242, and 243 so as to expose at least a part of each of the first through third upper electrodes 231, 232, and 233. The photoresist layer may be used in a process of forming the contact holes, thereby preventing the first through third intermediate layers 221, 222, and 223 from being damaged.

Thereafter, as shown in FIG. 20, the common electrode 235 contacting the first through third upper electrodes 231, 232, and 233 through the contact holes may be formed over the filling layer 250. The common electrode 235 may be a transparent or translucent electrode. The common electrode 235 may include a layer formed of Li, Ca, LiF/Ca, LiF/Al, Al, Mg, or a combination thereof, and another layer formed of a transparent or translucent material, such as ITO, IZO, ZnO, or $In_2O_3$. The common electrode 235 may be a reflective electrode formed of reflective metal.

The method of manufacturing the organic light-emitting display apparatus according to the present embodiment may use a light-blocking photoresist layer, thereby minimizing damage to an intermediate layer, including an emission layer, during a manufacturing process of the organic light-emitting display apparatus.

In the meantime, the method of manufacturing the organic light-emitting display apparatus according to the present exemplary embodiment may simultaneously pattern the first intermediate layer 221, the first upper electrode 231, and the first protection layer 241. Therefore, as shown in FIG. 18, the first protection layer 241 may be patterned in the same shape as that of the first upper electrode 231. In more detail, a side surface of the first protection layer 241 may be flush with a side surface of the first upper electrode 231. In the same manner, a side surface of the second protection layer 242 may be flush with a side surface of the second upper electrode 232, and a side surface of the third protection layer 243 may be flush with a side surface of the third upper electrode 233. The filling layer 250 may be in direct contact with the side surfaces of the first through third intermediate layers 221, 222, and 223, and the side surfaces of the first through third upper electrodes 231, 232, and 233.

A method of manufacturing the organic light-emitting display apparatus according to exemplary embodiments is described above, but the present invention is not limited thereto. For example, an exemplary embodiment may also include the organic light-emitting display apparatus manufactured using the same method as described above.

The organic light-emitting display apparatus according to an exemplary embodiment may have a structure as shown in FIG. 12. The organic light-emitting display apparatus according to the present exemplary embodiment may include the first through third pixel electrodes 211, 212, and 213 that are spaced apart from each other. The insulating layer 180, i.e. a pixel-defining layer, may expose at least the center portion of each of the first through third pixel electrodes 211, 212, and 213. The first intermediate layer 221 including a first emission layer may be located over the first pixel electrode 211. The second intermediate layer 222, including a second emission layer, may be located over the second pixel electrode 212. The third intermediate layer 223, including a third emission layer, may be located over the third pixel electrode 213.

The first through third upper electrodes 231, 232, and 233 may be located over the first through third intermediate layers 221, 222, and 223 and may be spaced apart from each other to respectively correspond to the first through third intermediate layers 221, 222, and 223. The first through third protection layers 241, 242, and 243 may also be located over the first through third upper electrodes 231, 232, and 233 and may be spaced apart from each other to respectively correspond to the first through third upper electrodes 231, 232, and 233. The first through third protection layers 241, 242, and 243 may be in contact with each other. The first through third protection layers 241, 242, and 243 may cover the side surfaces of the first through third upper electrodes 231, 232, and 233, and the first through third intermediate layers 221, 222, and 223.

The filling layer 250 may cover the first through third upper electrodes 231, 232, and 233, i.e. the first through third protection layers 241, 242, and 243 include contact holes to, and expose a part of each of the first through third upper electrodes 231, 232, and 233. To this end, the first through third protection layers 241, 242, and 243 may also include contact holes.

The contact holes of the first through third protection layers 241, 242, and 243 may be understood as additional contact holes so as to be distinguished from the contact holes of the filling layer 250. The common electrode 235 located over the filling layer 250 may be in contact with the first through third upper electrodes 231, 232, and 233 through the contact holes and the additional contact holes. In some embodiments, the contact holes of the filling layer 250 are disposed at locations corresponding to the insulating layer 180.

The above-described organic light-emitting display apparatus may prevent the first through third intermediate layers 221, 222, and 223 from being damaged during a manufacturing process. Thus, an organic light-emitting display apparatus having excellent display performance and a long operational lifetime may be manufactured.

The organic light-emitting apparatus device according to an exemplary embodiment may have a structure shown in FIG. 20. That is, the first through third protection layers 241, 242, and 243 may be spaced apart from each other and may have the same patterned shapes as the first through third upper electrodes 231, 232, and 233. Accordingly, a side surface of the first protection layer 241 may be flush with a side surface of the first upper electrode 231, a side surface of the second protection layer 242 may be flush with a side surface of the second upper electrode 232, and a side surface of the third protection layer 243 may be flush with a side surface of the third upper electrode 233. The filling layer 250 may be in direct contact with the side surfaces of the first through third intermediate layers 221, 222, and 223, and the side surfaces of the first through third upper electrodes 231, 232, and 233.

As described above, according to the one or more of the above exemplary embodiments, a method of easily manufacturing an organic light-emitting display apparatus while minimizing damage to an emission portion, including an emission layer, and the organic light-emitting display apparatus may be implemented.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
   forming a first pixel electrode and a second pixel electrode that are spaced apart from each other;
   forming an insulating layer that covers the first pixel electrode and the second pixel electrode;
   patterning the insulating layer to cover the second pixel electrode and to expose at least a center portion of the first pixel electrode;
   forming a first intermediate layer comprising a first emission layer over the exposed center portion of the first pixel electrode and the insulating layer;
   forming a first upper electrode over the first intermediate layer to correspond to at least the first pixel electrode;
   forming a light-blocking first photoresist layer over the first upper electrode to correspond to the first pixel electrode and not to correspond to the second pixel electrode;
   is removing parts of the first intermediate layer and the first upper electrode that are exposed outside the first photoresist layer;
   removing the first photoresist layer;
   patterning the insulating layer to expose at least a center portion of the second pixel electrode;
   forming a second intermediate layer comprising a second emission layer over the exposed center portion of the second pixel electrode and the first upper electrode;
   forming a second upper electrode over the second intermediate layer to correspond to at least the second pixel electrode;
   forming a light-blocking second photoresist layer over the second upper electrode to correspond to the second pixel electrode and not to correspond to the first pixel electrode;
   removing parts of the second intermediate layer and the second upper electrode that are exposed outside the second photoresist layer; and
   removing the second photoresist layer.

2. The method of claim 1, further comprising, between the removing of the first photoresist layer and the exposing of at least the center portion of the second pixel electrode, forming a first protection layer corresponding to the first pixel electrode to cover the first intermediate layer and the first upper electrode.

3. The method of claim 2, wherein the forming of the first protection layer comprises forming the first protection layer to cover an upper surface of the first upper electrode, a side surface of the first upper electrode, and a side surface of the first intermediate layer.

4. The method of claim 2, further comprising forming a second protection layer corresponding to the second pixel electrode to cover the second intermediate layer and the second upper electrode.

5. The method of claim 4, wherein the forming of the second protection layer comprises forming the second protection layer to cover upper surfaces and side surfaces of the second intermediate layer and the second upper electrode.

6. The method of claim 5, wherein the forming of the second protection layer comprises forming the second protection layer to contact the first protection layer.

7. The method of claim 4, further comprising:
   forming a filling layer that covers the first protection layer and the second protection layer;
   forming contact holes in the filling layer, the first protection layer, and the second protection layer to expose at least a part of each of the first upper electrode and the second upper electrode; and
   forming a common electrode over the filling layer to contact the first upper electrode and the second upper electrode through the contact holes.

8. The method of claim 1, further comprising, between the forming of the first upper electrode and the forming of the first photoresist layer, forming a first protection layer over the first upper electrode, wherein:
the forming of the first photoresist layer comprises forming the first photoresist layer over the first protection layer; and
the removing of the parts of the first intermediate layer and the first upper electrode that are exposed outside the first photoresist layer comprises removing parts of the first intermediate layer, the first upper electrode, and the first protection layer that are exposed outside the first photoresist layer.

9. The method of claim 8, further comprising, between the forming of the second upper electrode and the forming of the second photoresist layer, forming a second protection layer over the second upper electrode,
wherein:
the forming of the second photoresist layer comprises forming the second photoresist layer over the second protection layer; and
wherein the removing of the parts of the second intermediate layer and the second upper electrode that are exposed outside the second photoresist layer comprises removing parts of the second intermediate layer, the second upper electrode, and the second protection layer that are exposed outside the second photoresist layer.

10. The method of claim 9, further comprising:
forming a filling layer that covers the first protection layer and the second protection layer;
forming contact holes in the filling layer, the first protection layer, and the second protection layer to expose at least a part of each of the first upper electrode and the second upper electrode; and
forming a common electrode over the filling layer to contact the first upper electrode and the second upper electrode through the contact holes.

* * * * *